United States Patent [19]

Tinder

[11] Patent Number: 4,547,840
[45] Date of Patent: Oct. 15, 1985

[54] LAMP HOLDER FOR MOUNTING A LAMP ON A CIRCUIT BOARD

[75] Inventor: David V. Tinder, Dearborn, Mich.

[73] Assignee: United Technologies Automotive, Inc., Dearborn, Mich.

[21] Appl. No.: 656,840

[22] Filed: Oct. 2, 1984

[51] Int. Cl.$^4$ ............................................. H01R 33/00
[52] U.S. Cl. ................................... 362/226; 362/396; 362/436; 362/438
[58] Field of Search ............... 362/226, 382, 396, 436, 362/438

[56] References Cited

U.S. PATENT DOCUMENTS 4,177,497 12/1979 McCook et al. .................. 362/29 X
4,318,158 3/1982 Livermore et al. ............. 362/29 X

*Primary Examiner*—Peter A. Nelson
*Attorney, Agent, or Firm*—Stephen A. Schneeberger

[57] ABSTRACT

A one-piece plastic holder is provided for mounting a generally tubular lamp on a circuit board. The lamp has a filament connected to a pair of leads extending from the lamp base. The lamp holder includes an annular base portion adapted to be supported on a surface of a circuit board, a support spine extending upwardly from the base portion, at least two angularly-spaced, snap-fit mounting members depending from the base portion for insertion through respective mounting apertures in the circuit board and for locking engagement with the reverse surface of the board, and a pair of notches in the lamp base portion through which the respective pair of lamp leads may be led. The support spine of the lamp holder includes a clamp, as for instance a pair of opposed arcuate jaws for resiliently engaging and retaining a respective lamp. The geometry of the lamp holder mounting members and the circuit board apertures cooperatively serve to key the holder to a predetermined angular orientation relative to the circuit board. The notches in the lamp holder base portion are spaced 180° from one another in predetermined angular relation with the lamp holder, such that the lamp is mounted in predetermined angular relation to the holder. The lamp holder mounting members are spaced 180° from one another and differ from each other in respective cross-sectional geometries so as to effect the angularly keyed relation with the circuit board.

7 Claims, 5 Drawing Figures

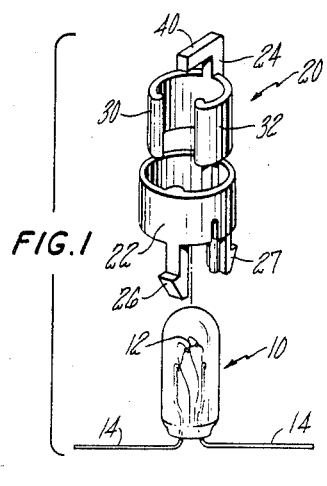
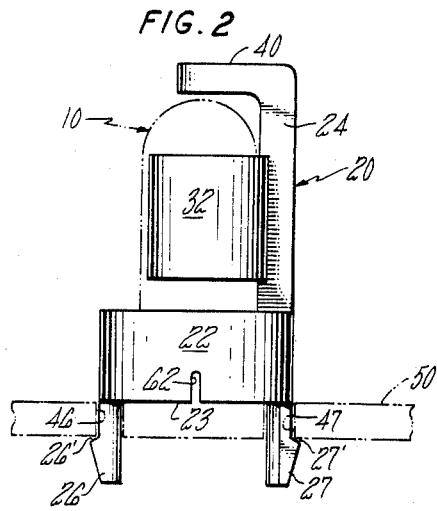
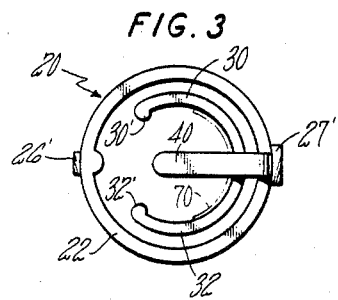
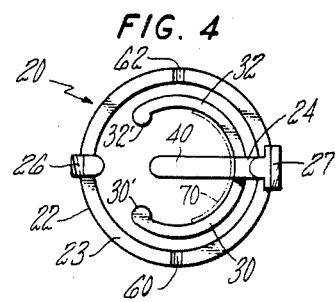
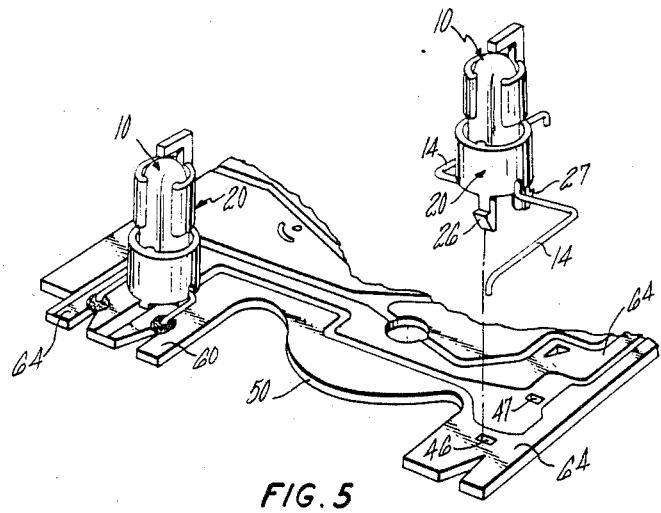

LAMP HOLDER FOR MOUNTING A LAMP ON A CIRCUIT BOARD

DESCRIPTION

1. Technical Field

The present invention relates to a lamp holder and more particularly to a lamp holder for mounting a lamp on a circuit board. More particularly still, the invention relates to a one-piece lamp holder for mounting a generally tubular lamp.

2. Background Art

Various arrangements exist for mounting indicator or illumination lamps in conjunction with electrical or electronic equipment. For instance, in U.S. Pat. No. 2,932,820 there is disclosed a U-shaped clip which is threadedly mounted to the panel of some electronic equipment and which serves to retainedly embrace an ordinary pilot lamp between its arms. Such arrangement, while providing considerable flexibility as regards its ability to embrace a lamp in a variety of positions, may not be particularly well suited for low-cost circuit board mounting arrangements nor for providing a precise orientation to the lamp.

U.S. Pat. No. 4,013,857 discloses a lamp holder of split generally tubular configuration and positioned in association with a switch. The lamp holder is formed as an integral part of a cover plate member. The lamp is resiliently embraced in the lamp holder.

U.S. Pat. No. 3,292,174 discloses an indicating lamp holder which is snap-fit mounted in an opening in a panel. The tubular lamp is positioned in the holder within a range of angular orientations about its longitudinal axis. Support and orientation for the lamp relative to its holder appears to be provided by the forming of its leads, which are connected to a contact board.

In U.S. Pat. Nos. 3,511,982, 4,193,653 and 4,299,430 there are illustrated several different lamp holders for mounting generally tubular, baseless lamps in or on circuit boards. In each instance the holder is mounted on a circuit board by rotating the holder to bring a camming surface thereon into snug engagement with the circuit board. Such arrangements typically require a relatively large mounting opening in the circuit board through which the lamp and holder extend. Moreover, while some provision may exist for angularly orienting the bulb within its holder to provide a desired orientation of the filament relative to the holder, the requirement that the holder be rotated to effect its mounting on the circuit board may not always yield a precise, desired orientation of the lamp filament relative to the board.

DISCLOSURE OF INVENTION

It is a principle object of the present invention to provide an improved one-piece lamp holder for mounting a lamp on a circuit board. Included in this object is the provision that such lamp holder be of relative simplicity and economical to manufacture. Further included in this object is the provision of such lamp holder with the ability, in conjunction with the circuit board, to insure a precise angular orientation of the lamp filament. An even further object of the invention is the provision of such a lamp holder without requiring a relatively large mounting aperture in the circuit board.

In accordance with the invention there is provided an improved lamp holder for mounting a generally tubular lamp on a circuit board. The lamp holder is of one-piece construction, preferably of molded plastic. The lamp has a filament connected to a pair of leads extending from the lamp base. The lamp holder includes an annular base portion adapted to be supported on a surface of a circuit board, a support spine extending upwardly from the base portion, at least two angularly-spaced, snap-fit mounting members depending from the base portion for insertion through respective mounting apertures in the circuit board and for locking engagement with the reverse surface of the board, and a pair of notches in the lamp base portion through which the respective pair of lamp leads may be led. The lamp holder base portion is sized to receive therein at least the base of a respective lamp and is preferably open at its bottom for insertion of the lamp therethrough. The support spine of the lamp holder includes a clamp, as for instance a pair of opposed arcuate jaws for resiliently engaging and retaining a respective lamp. The jaws are substantially concentric with the lamp holder base portion and have a slightly smaller radius than that of the lamp to be engaged therewithin. The geometry of the lamp holder mounting members and the circuit board apertures cooperatively serve to key the holder to a predetermined angular orientation relative to the circuit board. The notches in the lamp holder base portion are spaced substantially opposite, or at about 180°, from one another in predetermined angular relation with the lamp holder, such that the lamp is mounted in predetermined angular relation to the holder. The lamp holder mounting members are spaced 180° from one another and differ from each other in respective cross-sectional geometries so as to effect the angularly keyed relation with the circuit board. A stop member extends radially inward from the lamp holder support spine and limits upward displacement of a lamp relative to the holder base portion.

BRIEF DESCRIPTION OF DRAWINGS

FIG. 1 is an exploded view of a lamp and a lamp holder in accordance with the invention;

FIG. 2 is a side elevation of the lamp holder of FIG. 1;

FIG. 3 is a top view of the lamp holder of FIG. 2;

FIG. 4 is a bottom view of the lamp holder of FIG. 2; and

FIG. 5 is a view, partly exploded, of the lamp holder of the invention in operative association with a circuit board.

BEST MODE FOR CARRYING OUT THE INVENTION

Referring to FIG. 1 there is illustrated a conventional incandescent lamp 10 having a filament 12 supported by and connected to a pair of electrical leads 14 extending from the base thereof at opposite sides of the lamp envelope. The lamp 10 is generally tubular in cross-section and may have a wedge-type base. Lamp 10 might typically be a #2182 lamp manufactured by the General Instrument Company. Lamp 10 is shown prior to installation upwardly into the lamp holder 20 of the invention.

Referring also to FIGS. 2-4, lamp holder 20 is a one-piece element, preferably of molded plastic for relatively low-cost manufacture. Lamp holder 20 includes a cylindrical or annular base portion 22 having a support spine 24 extending upwardly therefrom and a pair of mounting members 26 and 27 depending therefrom.

A resilient bulb retaining or latching mechanism is provided by a pair of opposed, arcuate jaws 30 and 32 commonly joined at their base to the support spine 24. The inside diameter of the lamp holder base portion 22 is somewhat greater than that of the outside diameter of the lamp 10 to permit insertion therethrough. On the other hand, the radius or inside diameter of the jaws 30, 32, or at least the small radially inwardly extending lips 30', 32', is slightly smaller than the corresponding outside dimension of a lamp 10 to insure resilient engaging contact therebetween. The angular extent of the respective jaws 30, 32 is cumulatively greater than 180°, for example being about 270°, to securely engage the lamp 10 and provide a rearwardly directed component to the engaging force for urging the lamp into supported contact with the spine 24.

As illustrated in FIG. 1, the lamp 10 is mounted in the lamp holder 20 by upward insertion through the annular base portion 22 and into the aforementioned resilient engagement by the clamping jaws 30, 32. A stop member 40 extends from the upper end of spine 24 transversely of the longitudinal extent of the lamp 10 to limit the upward displacement of the lamp relative to the holder 20. The stop member 40 may extend radially inward from spine 24 to a position near or somewhat beyond the axis of the annular base portion 22.

The mounting members 26 and 27 depend from opposite positions on the underside 23 of lamp holder base portion 22. Each mounting member 26, 27 is of sufficient length to extend entirely through a respective aperture 46, 47 in a circuit board 50. Although the mounting members 26 and 27 might be heat staked to the undersurface of board 50, in a preferred embodiment they are formed to be of the snap-fit or snap-lock type which does not require heat staking. Specifically, the outer surface of each of the locking members 26, 27 is outwardly inclined in an upward direction from its bottom extremity, to provide a camming surface therealong, and terminates to form a respective locking shoulder or tab 26', 27'. The locking tabs 26', 27' extend radially outward beyond the outer dimensions of the respective circuit board apertures 46, 47 and are also spaced below the undersurface 23 of lamp holder base portion 22 by a distance which is only slightly greater than the thickness of the circuit board 50 to provide secure mounting engagement with the circuit board. The outside dimensions of the lowermost ends of the mounting members 26, 27 are slightly less than the corresponding dimension of the respective mounting apertures 46, 47 to facilitate the entry of the mounting members thereinto. Upon downward displacement of lamp holder 20 relative to circuit board 50, the camming action on the mounting members 26, 27 displace them relatively inward until the respective locking tabs 26', 27' clear the under surface of the circuit board and snap outwardly to lock the lamp holder in position.

In accordance with an aspect of the invention, the mounting members 26 and 27 are configured somewhat differently from one another in order to key the lamp holder 20 to a precise angular orientation relative to the circuit board 50. Specifically, the mounting member 26 is narrower, i.e. of lesser angular extent, than the mounting member 27 and correspondingly, the corresponding dimensions of the respective mounting apertures 46, 47 in circuit board 50 are similarly scaled to insure keyed mounting of the lamp holder to a single position.

Further in accordance with the invention, a pair of apertures, such as notches 60 and 62 are formed in the lamp holder base portion 22 at diagonally opposite positions and are sized to allow a respective one of the pair of lamp leads 14 to be led outwardly through each. The lead notches 60, 62 are formed by notches extending upwardly from the base 23 of base portion 22 and are each angularly displaced 90° from the spine 24.

In the conventional design of small lamps such as lamp 10, filament 12 is in substantially the same plane as the plane which includes electrical leads 14 as they are housed within the lamp 10 and leave the glass envelope. Thus, once the lamp 10 is positioned within holder 20, if each of the leads 14 is led radially outward through a respective one of the notches 60, 62 and the leads are tensioned, as by bending, to provide the shortest lead-out distance from within the lamp holder, the filament 12 will be oriented in a precise plane relative to the holder. Specifically, filament 12 will exist in a plane that substantially includes the two notches 60, 62. Accordingly, with the filament 12 positioned in a predetermined position in lamp holder 20, the lamp holder may then be mounted on circuit board 50 in the keyed position determined by apertures 46, 47 and mounting tabs 26, 27 to insure a predetermined orientation of the lamp. Such orientation will maximize the forwardly-directed light, it being appreciated that the angular extent of clamping jaws 30, 32 is limited so as to maximize the view of filament 12 by a viewer in front.

In the embodiment illustrated in FIG. 5, the lamp leads 14 are illustrated as being in electrical contact with conductive contact surfaces 64 disposed on the upper surface of circuit board 50, as by being soldered thereto and/or by pinched engagement in notches formed in the edge of the circuit board. It will be appreciated, however, that other provisions for electrical connection with the lamp leads 14 are also possible. It will also be understood that while the lamp holder 20 of the illustrated embodiment serves to orient a lamp 10 such that its longitudinal extent is substantially normal to the surface of circuit board 50, alternate configurations might also be possible while retaining the advantages of the invention. For instance, if the uppermost portion of the lamp holder base portion 22 were provided with a 90° forwardly-extending bend, the lamp 10 might then be oriented substantially parallel to the circuit board 50 and extend toward the viewer.

To enhance the reflection of light toward the observer, the forward or inner surface of the jaws 30, 32 may have a light-reflective surface 70 disposed thereon, as illustrated in broken line in FIGS. 3 and 4. The light-reflective surface 70 may be applied by vapor deposition, plating, an adhesive backing or the like and will limit its angular extent to that necessary for generally-forward reflection of light.

Although this invention has been shown and described with respect to detailed embodiments thereof, it will be understood by those skilled in the art that various changes in form and detail thereof may be made without departing from the spirit and scope of the claimed invention.

Having thus described a typical embodiment of my invention, that which is claimed as new and desired to secure by Letters Patent of the United States is:

1. An improved one-piece lamp holder for mounting a lamp on a circuit board, the lamp being generally tubular and having a filament connected to a pair of leads, said holder comprising:

an annular base portion adapted to be supported on a surface of a circuit board and sized to receive therein at least the base of a respective lamp;

a support spine extending upwardly from said base portion and including clamp means for resiliently engaging and retaining a respective lamp;

at least two angularly-spaced, mounting members depending from said base portion for insertion through respective mounting apertures in the circuit board and for locking engagement with the reverse surface of the board, the geometry of said mounting members and circuit board apertures cooperatively serving to key said holder to a predetermined angular orientation relative to the circuit board; and a pair of aperture means in said lamp holder base portion through which the respective pair of lamp leads may be led, each said aperture means of said pair being spaced substantially opposite the other and in predetermined angular relation with said mounting members such that the lamp is mounted in predetermined angular relation to the board.

2. The lamp holder of claim 1 wherein said mounting members are of a snap-lock type and are spaced approximately 180° from one another and differ from one another in respective cross-sectional geometry to effect said angularly-keyed relation with the circuit board.

3. The lamp holder of claim 2 wherein said clamp means comprises a pair of arcuate jaws extending circumferentially from said support spine, said jaws being substantially concentric with said base portion and including portions being at a slightly smaller radius than that of the lamp.

4. The lamp holder of claim 3 wherein each said aperture means comprises a respective slot in the bottom of said base portion.

5. The lamp holder of claim 3 wherein said base is open at its bottom for insertion of the lamp therethrough and said support spine further includes a stop member extending radially inward therefrom and axially positioned to limit the upward displacement of a lamp relative to said base portion.

6. The lamp holder of claim 3 wherein each said jaw of said pair extends more than 90° but less than 180° from said spine, and is of said axial extent and positioning to coincide with the positioning of the lamp filament and further includes a light-reflective surface facing the lamp.

7. The lamp holder of claim 4, said lamp holder being formed of molded plastic.

* * * * *